United States Patent
Lee

(10) Patent No.: US 6,784,821 B1
(45) Date of Patent: Aug. 31, 2004

(54) SYNCHRONIZING CIRCUITS AND METHODS FOR PARALLEL PATH ANALOG-TO-DIGITAL CONVERTERS

(75) Inventor: Soo-Hyoung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/689,435

(22) Filed: Oct. 20, 2003

(30) Foreign Application Priority Data

Feb. 11, 2003 (KR) ................................ 10-2003-0008630

(51) Int. Cl.[7] ................................................ H03M 1/12
(52) U.S. Cl. ........................ 341/155; 315/159; 315/101
(58) Field of Search ................................ 341/155, 159, 341/101

(56) References Cited

U.S. PATENT DOCUMENTS

| | | | | |
|---|---|---|---|---|
| 5,870,038 A | * | 2/1999 | Tomita et al. ............... 341/61 |
| 6,031,477 A | * | 2/2000 | Mercer ....................... 341/144 |
| 6,111,531 A | * | 8/2000 | Farag ......................... 341/143 |
| 6,184,813 B1 | * | 2/2001 | Abughazaleh et al. ...... 341/144 |
| 6,211,806 B1 | * | 4/2001 | McCarroll ................... 341/155 |
| 6,229,860 B1 | * | 5/2001 | Chen .......................... 341/131 |
| 6,437,713 B1 | * | 8/2002 | Lesea .......................... 341/78 |
| 6,542,099 B1 | * | 4/2003 | Schofield et al. ........... 341/144 |
| 6,664,906 B2 | * | 12/2003 | Volk ........................... 341/136 |

* cited by examiner

Primary Examiner—Michael Tokar
Assistant Examiner—Lam T. Mai
(74) Attorney, Agent, or Firm—Myers Bigel Sibley & Sajovec

(57) ABSTRACT

An Analog-to-Digital (A/D) converter includes signal paths that are responsive to an analog input signal, to generate a multi-bit digital signal. A respective signal path includes a comparator. A synchronizing circuit is responsive to a clock signal and outputs of the comparators, to generate a respective delayed clock signal that is applied to a respective comparator. A respective signal path also includes a respective decoder that is responsive to a respective comparator and to the clock signal.

14 Claims, 6 Drawing Sheets

SYNCHRONIZING CIRCUITS AND METHODS FOR PARALLEL PATH ANALOG-TO-DIGITAL CONVERTERS

RELATED APPLICATION

This application claims the benefit of Korean Patent Application No. 2003-0008630, filed Feb. 11, 2003, the disclosure of which is hereby incorporated herein by reference in its entirety as if set forth fully herein.

FIELD OF THE INVENTION

The present invention relates to Analog-to-Digital (AID) converters, and more particularly to parallel path A/D converters.

BACKGROUND OF THE INVENTION

Analog-to-Digital (A/D) converters are widely used to convert an analog input signal to a multi-bit digital output signal. As is well known to those having skill in the art, a class of A/D converters is a parallel path A/D converter, also referred to herein as a multi-process A/D converter. In a parallel path A/D converter, a plurality of signal paths are responsive to an analog input signal, to generate a multi-bit digital signal therefrom. A respective signal path includes therein a comparator.

FIG. 1 illustrates an example of a conventional multi-process A/D converter. As shown in FIG. 1, the A/D converter receives an analog input signal SI from, for example, an external terminal, converts the received input signal into digital signals via multiple paths comprised of a plurality of process routines 102, 104 and 106, a plurality of comparators 108, 110 and 112, and a plurality of decoders 114, 116 and 118, and then generates an n-bit digital output signal DO[0:n−1] therefrom.

A/D-converted digital signals PO1–PO(N) are generated from the plurality of comparators 108, 110 and 112 respectively connected to the process routines 102, 104 and 106. The A/D-converted digital signals PO1–PO(N) are compared and analyzed in a synchronizing circuit 122, so that synchronized signals CSO1 to CSO(N) are generated from the synchronizing circuit 122, and then applied to the decoders 114, 116 and 118 respectively corresponding to the process routines 102, 104 and 106. Digital output signals DO[0:i−1]–DO[m:n−1] generated from the decoders 114, 116 and 118, corresponding to the respective process routines, constitute the n-bit digital output signal DO[0:n−1].

The analog input signal SI propagates with different time delays while passing through the different signal paths, having different signal distortions from one another. However, in the conventional A/D converter of FIG. 1, since the comparators 108, 110 and 112, the decoders 114, 116 and 118, and the synchronizing circuit 122 are controlled on respective paths by the same internal clock signal ICLK provided by a clock buffer 120, an erroneous conversion of the signals may occur, which may result in the generation of erroneous signals. The conventional synchronizing circuit 122 of FIG. 1 generally performs a latching function of synchronizing the output signals of the comparators to a clock signal, and a function of correcting the generated erroneous signals.

FIG. 2 is a block diagram illustrating an example of a conventional parallel path A/D converter with folding/interpolation and flash process routines. The A/D converter of FIG. 2 receives an analog input signal SI from, for example, an external terminal, converts the received signal SI into a digital signal via both paths of the folding/interpolation process routine 202 and the flash process routine 204, and then generates a digital output signal DO of a desired bit-number therefrom. Also, in the A/D converter of FIG. 2, the analog input signal SI propagates with different time delays while passing through the different signal paths, being distorted with different patterns from one another. However, in the conventional A/D converter of FIG. 2, since the comparators 206 and 208, the decoder 214 and the synchronizing circuit 212 are controlled on each path by the same internal clock signal ICLK provided by a clock buffer 210, an erroneous conversion of the signals may occur, which may result in the generation of erroneous signals. The conventional synchronizing circuit 212 of FIG. 2 compares the signals, which are input through different paths from each other, to synchronize them to the clock signal.

FIG. 3 is a timing diagram that illustrates a process of synchronization according to a synchronizing circuit of FIG. 2. FIG. 4 illustrates a synchronizing circuit of FIG. 2 using a logic circuit.

In FIG. 3, it is assumed that the Most Significant Bit (MSB) and the second most significant bit MSB-1 are a signal PO1 passing via the folding/interpolation process routine 202 and the comparator 206 of FIG. 2, and that the third most significant bit MSB-2 is a signal PO2 passing via the flash process routine 204 and the comparator 208. In FIG. 3, the MSB and the MSB-1 are synchronized to each other, but the MSB and the MSB-2, or the MSB-1 and the MSB-2 are not synchronized to each other. Accordingly, such asynchronous bit patterns may cause the converted digital signals to include code glitch errors. When synchronizing errors appearing at time points T3–T2 are present, it defines a time region A including the asynchronous time points T1–T4. Then, a synchronizing operation is performed for the region to be corrected by the synchronizing circuit as shown in FIG. 4.

In FIG. 4, it is assumed that the signal PO1 indicates the MSB, the signal PO2 indicates the MSB-2, and that the signal SA represents "1" within a range of the time region A while the signal SA represents "0" out of the range of the time region A. In synchronizing the MSB with the MSB-2, the MSB-2 is logically ORed with the MSB in the time region A after developing the same phase with the MSB by logic inversion. As a result of the OR operation, the MSB having an edge trigger later than the MSB-2 within the region A is synchronized to the MSB-2. Thus, the code glitch error can be corrected.

Unfortunately, it may be difficult to extend the range of error correction because the correcting region may be set for synchronization and the correcting region may be narrow. Furthermore, the conventional A/D converter may not conformably address the asynchronous signal, but may only correct the code glitch errors.

SUMMARY OF THE INVENTION

Some embodiments of the present invention provide an A/D converter that includes a plurality of signal paths that are responsive to an analog input signal, to generate a multi-bit digital signal therefrom. A respective signal path includes therein a comparator. A synchronizing circuit is responsive to a clock signal and outputs of the comparators, to generate a respective delayed clock signal that is applied to a respective comparator. In some embodiments, a respective signal path also includes therein a respective decoder that is responsive to a respective comparator and to the clock signal. In some embodiments, the synchronizing circuit is configured to generate a respective delay clock signal based on at least one phase difference between the outputs of the comparators.

Synchronizing methods according to some embodiments of the present invention may be used in A/D converters that include a plurality of signal paths that are responsive to an analog input signal, to generate a multi-bit digital signal therefrom, wherein a respective path includes therein a comparator. According to these methods, a plurality of delayed clock signals are generated from a clock signal and outputs of the comparators. A respective one of the delayed clock signals is applied to a respective comparator. In other embodiments, the clock signal is also applied to the respective decoders. In still other embodiments, the delayed clock signals are generated based on at least one phase difference between the outputs of the comparators.

Other embodiments of the present invention provide an A/D converter that comprises a clock buffer that is configured to receive and buffer an external clock signal, to thereby generate an internal clock signal. A plurality of process routines are configured to receive and process an analog input signal. The plurality of comparators are configured to receive analog signals from the plurality of process routines, and to compare the received analog signals with a reference voltage, to thereby generate digital signals therefrom, under control of a respective one of delayed clock signals. A plurality of decoders are configured to receive the digital signals from the plurality of comparators, and to convert the received digital signals into a code format, to thereby generate converted digital signals. A synchronizing circuit is configured to receive the internal clock signal from the clock buffer and the digital signals from the plurality of comparators, and to generate the respective delayed clock signals therefrom.

In still other embodiments, the synchronizing circuit includes a phase detector that is configured to receive the digital signals from the plurality of comparators and to detect a phase difference between the digital signals. A delay controller is configured to receive an output signal of the phase detector and to generate a respective time delay control signal for a respective one of the process routines, corresponding to the phase difference. A plurality of delay chain parts are configured to receive the internal clock signal from the clock buffer, and to generate the respective delayed clock signals, under control of a respective one of the time delay control circuits.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element is referred to as being "connected", "coupled" or "responsive" to another element, it can be directly connected, coupled or responsive to the other element or intervening elements may be present. In contrast, when an element is referred to as being "directly connected", "directly coupled" or "directly responsive" to another element, there are no intervening elements present.

Figure 1:
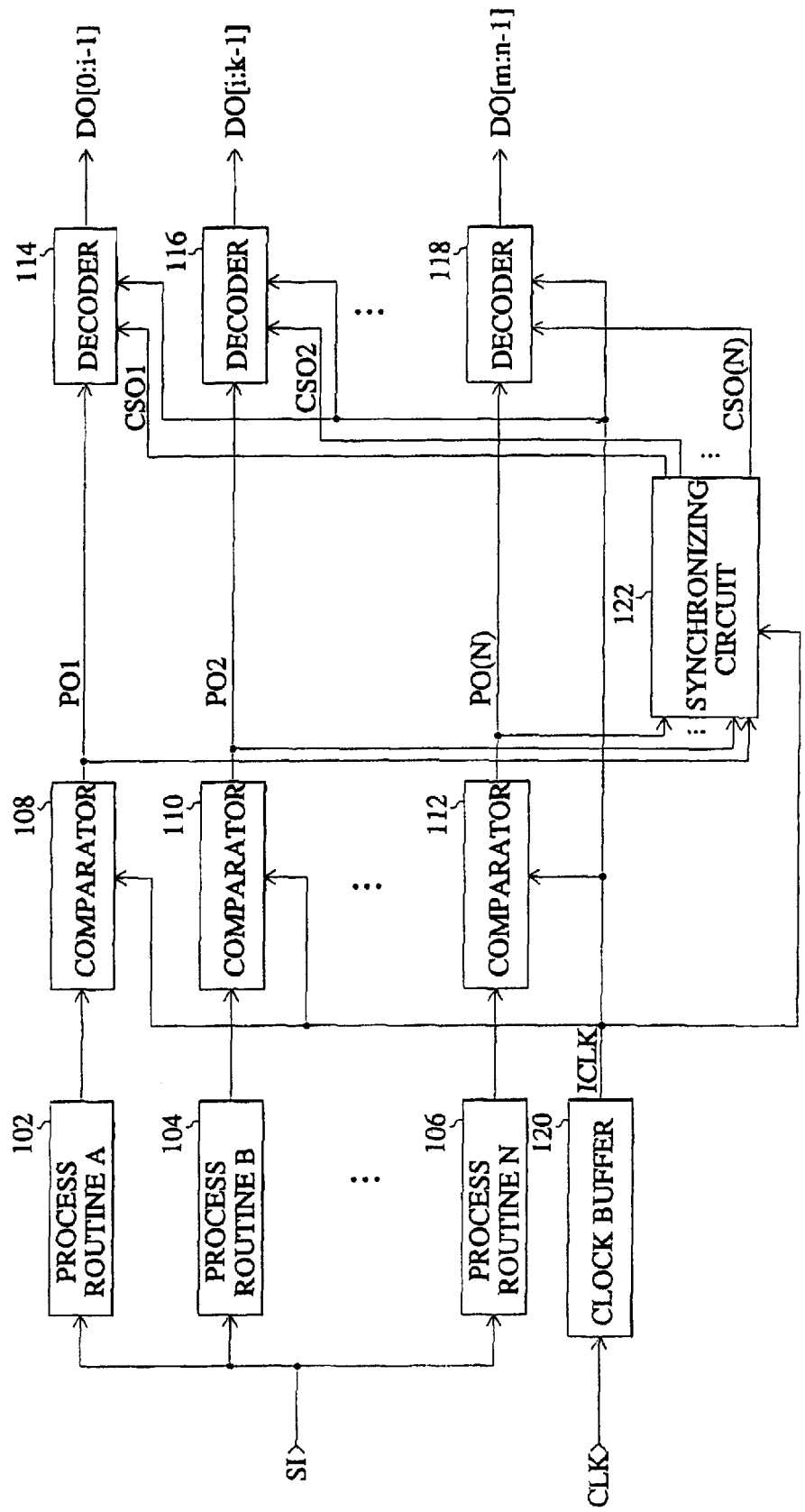
FIG. 1 is a block diagram illustrating an example of a conventional multi-process A/D converter.
Figure 2:
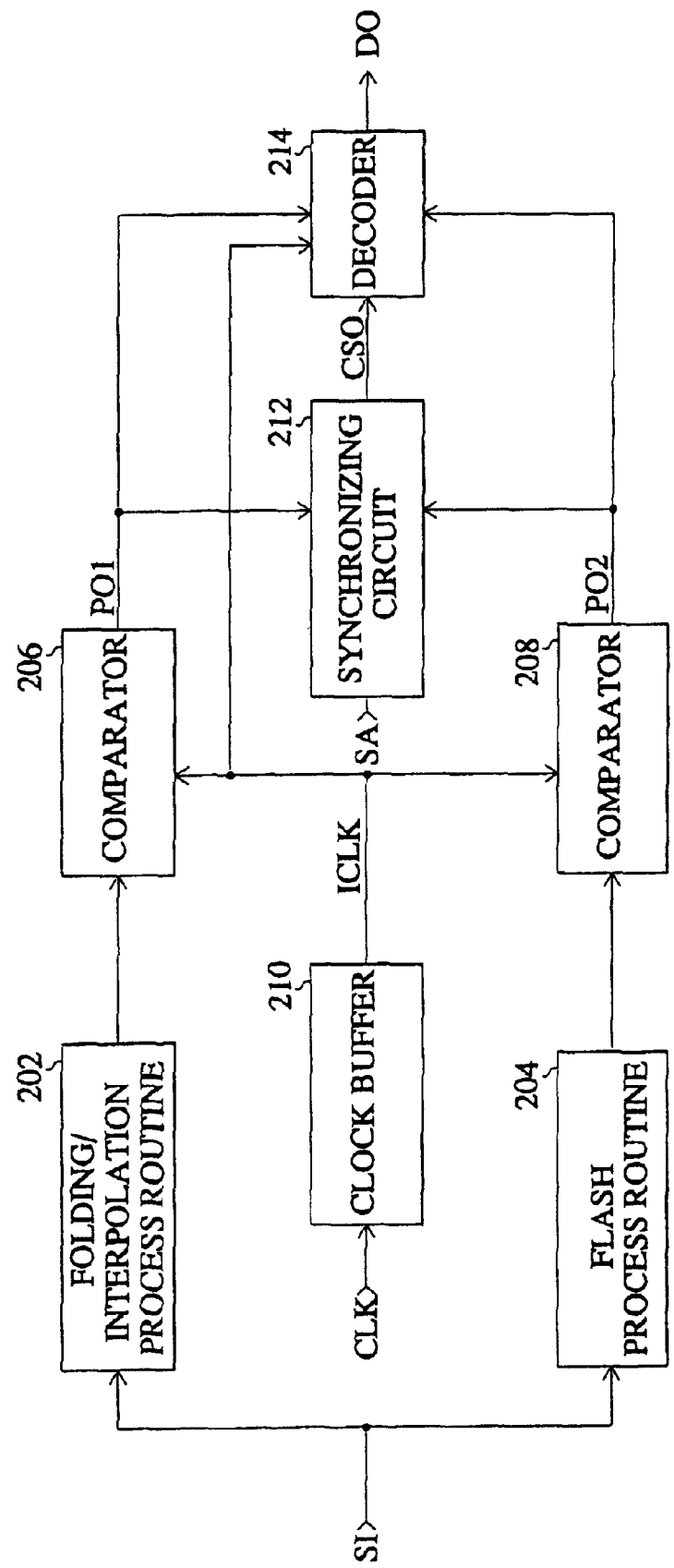
FIG. 2 is a block diagram illustrating an example of a conventional A/D converter comprised of folding/interpolation and flash process routines.
Figure 3:
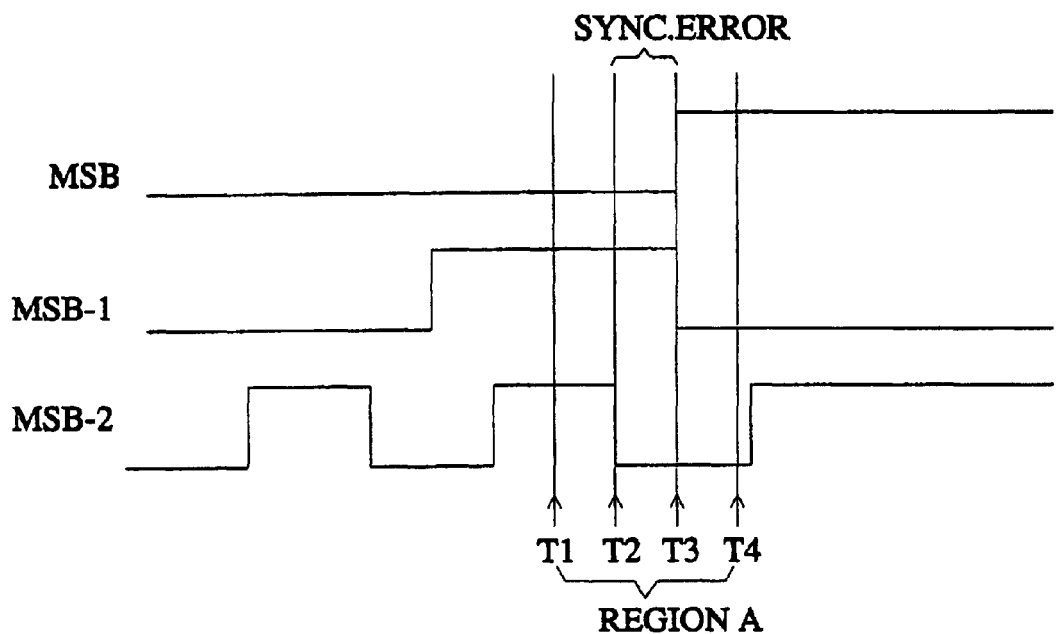
FIG. 3 is a timing diagram illustrating a method of synchronization using a synchronizing circuit of FIG. 2.
Figure 4:
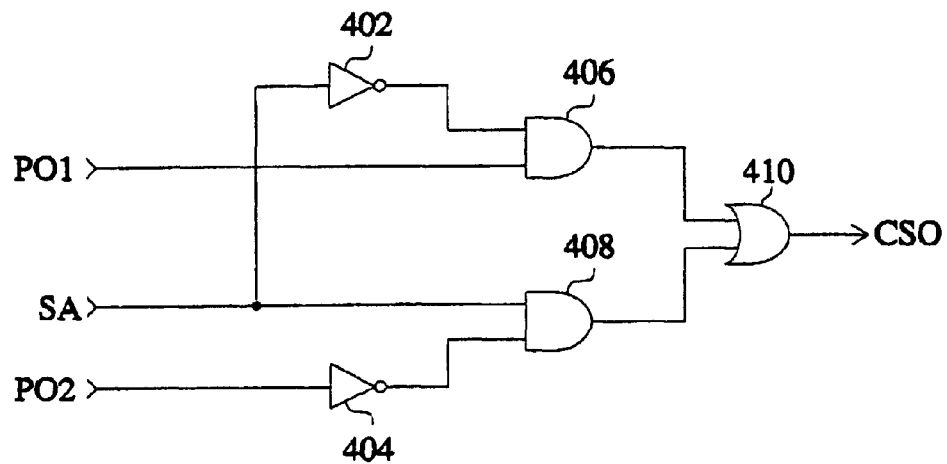
FIG. 4 is a circuit diagram illustrating a synchronizing circuit of FIG. 2 using a logic circuit.
Figure 5:
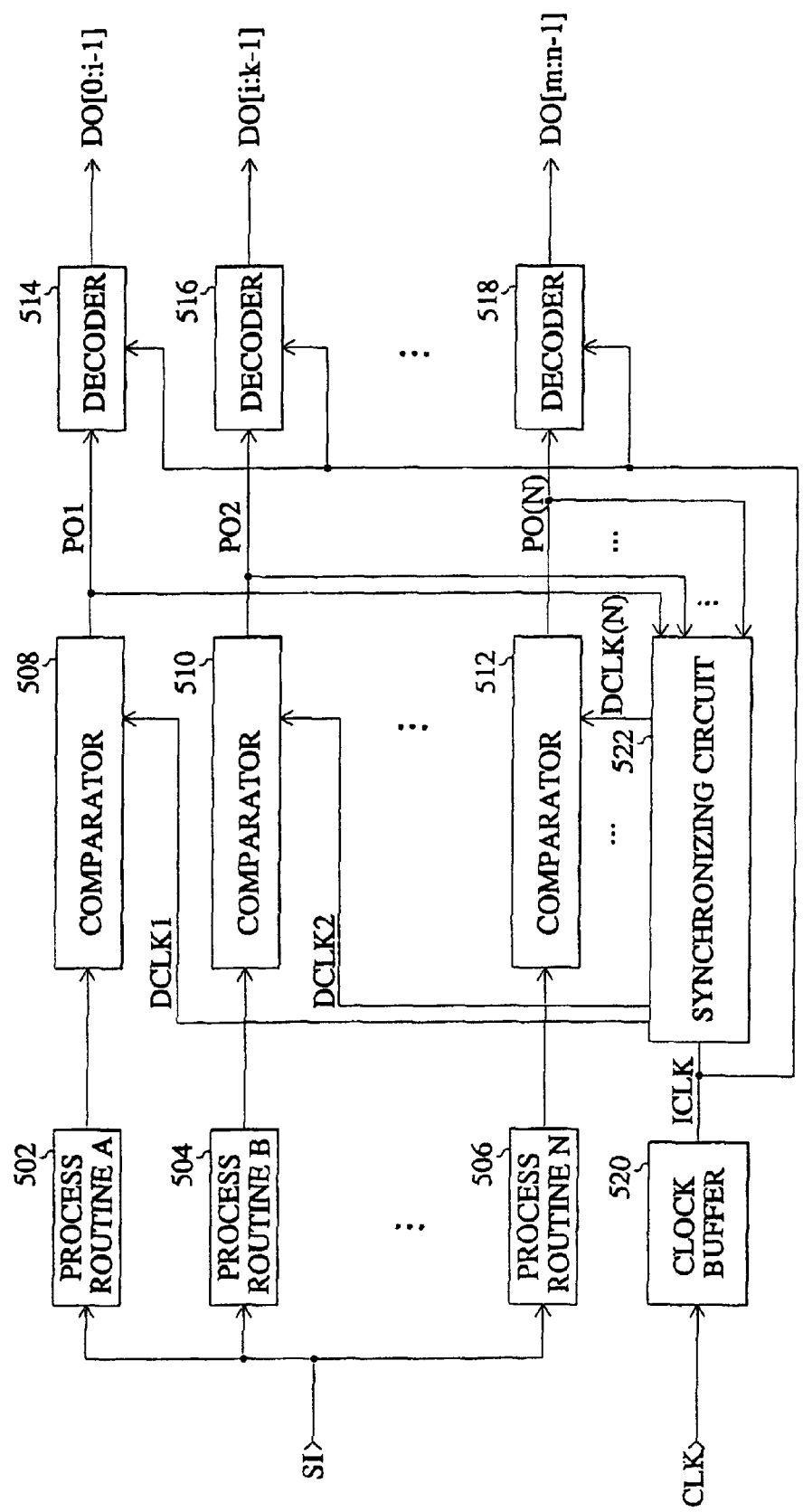
FIG. 5 is a block diagram illustrating A/D converters according to some embodiments of the present invention.

FIG. 5 is a block diagram illustrating A/D converters according to some embodiments of the present invention. As shown in FIG. 5, A/D converters according to some embodiments of the present invention include a plurality of signal paths that are responsive to an analog input signal SI, to generate a multi-bit digital signal DO[0:n−1] therefrom. A respective signal path includes therein a comparator 508, 510 and 512. A synchronizing circuit 522 is responsive to a clock signal, such as an internal clock signal ICLK provided by a clock buffer 520, and outputs PO1–PO(N) of the comparators 508, 510 and 512, to generate a respective delayed clock signal DCLK1 ... DCLK(N), that is applied to a respective comparator 508, 510 and 512. As also shown in FIG. 5, in some embodiments, a respective signal path also includes therein a respective decoder 514, 516 and 518 that is responsive to a respective comparator 508, 510 and 512 and to the clock signal ICLK. Finally, as also shown in FIG. 5 in other embodiments, the synchronizing circuit 522 is configured to generate a respective delayed clock signal DCLK1 ... DCLK(N) based on at least one phase difference between the outputs PO1 ... PO(N) of the comparators 508, 510 and 512. It will be understood that although three signal paths are illustrated in FIG. 5, fewer paths or more paths may be provided according to embodiments of the invention.

More specifically, referring to FIG. 5, in some embodiments, an A/D converter includes N process routines (N≧2) and generates an n-bit digital signal therefrom. As shown in FIG. 5, some embodiments of an A/D converter include the clock buffer 520 that is configured to receive and buffer an external clock signal CLK, to thereby generate the internal clock signal ICLK therefrom. A plurality of process routines 502, 504 and 506 are configured to receive and process the analog input signal SI. The plurality of comparators 508, 510 and 512 are configured to receive the analog signals from the plurality of process routines 502, 504 and 506, and to compare the received analog signals with a reference voltage under control of one of the delayed clock signals DCLK1 ... DCLK(N), to thereby generate digital signals PO1 ... PO(N) therefrom. The plurality of decoders 514, 516 and 518 are configured to receive the digital signals from the plurality of comparators 508, 510 and 512, and to convert the received signals into a code format, for example, a code format that is adapted to a digital logic circuit, to thereby generate converted digital signals. Finally, the synchronizing circuit 522 is configured to receive the internal clock signal ICLK from the clock buffer 520, and the digital output signals PO1 . . . PO(N) from the plurality of comparators 508, 510 and 512, to generate the respective delayed clock signals DCLK1 . . . DCLK(N) therefrom.

Henceforth, an operational example of a multi-process A/D converter according to some embodiments of the present invention as shown in FIG. 5 will be described.

As shown in FIG. 5, the multi-process A/D converter receives an analog input signal SI, for example, from an external terminal, and converts the received signal SI into digital signals via multiple (at least two) paths comprised of a plurality of process routines 502, 504 and 506, a plurality of comparators 508, 510 and 512, and a plurality of decoders 514, 516 and 518, to thereby generate an n-bit digital output signal DO[0:n−1] therefrom.

The plurality of comparators 508, 510 and 512 respectively connected to the plurality of process routines 502, 504 and 506 generate A/D-converted digital signals PO1–PO(N) therefrom. The A/D-converted digital signals PO1–PO(N) are fed back by the synchronizing circuit 522, so that the delayed clock signals DCLK1–DCLK(N) are generated from the synchronizing circuit 522, and then applied to the decoders 514, 516 and 518 respectively corresponding to the process routines 502, 504 and 506. Digital signals DO[0:i−1]–DO[m:n−1] generated from the decoders 514, 516 and 518 respectively corresponding to the process routines 502, 504 and 506 constitute the n-bit digital output signal DO[0:n−1]. The analog input signal SI propagates with different time delays while passing through the different signal paths, so that it may be distorted with different patterns from each other.

The synchronizing circuit 522 receives the respective output signals PO1–PO(N) from the comparators 508, 510 and 512, and detects phases of the received digital signals PO1–PO(N), to thereby generate the delayed clock signals DCLK1–DCLK(N), which can have time delays different from one another. The delayed clock signals DCLK1–DCLK(N) are applied to the comparators respectively corresponding to the process routines. Each of the comparators 508, 510 and 512 compares the analog signal from the process routine with a reference voltage under the control of one of the delayed clock signals DCLK1–DCLK(N), to thereby output the digital signal PO1–PO(N) therefrom. Thus, upon comparing the analog input signal with the reference voltage, the analog input signal is synchronized to the delayed clock signals DCLK1–DCLK(N). Similarly, the comparators on respective paths are controlled by the delayed clock signals DCLK1–DCLK(N) which can have time delays different from one another, so that the erroneous signals themselves generated due to the synchronization to the same internal clock signal can be reduced or corrected, thereby allowing reduced distortion of the analog input signals.

Figure 6:
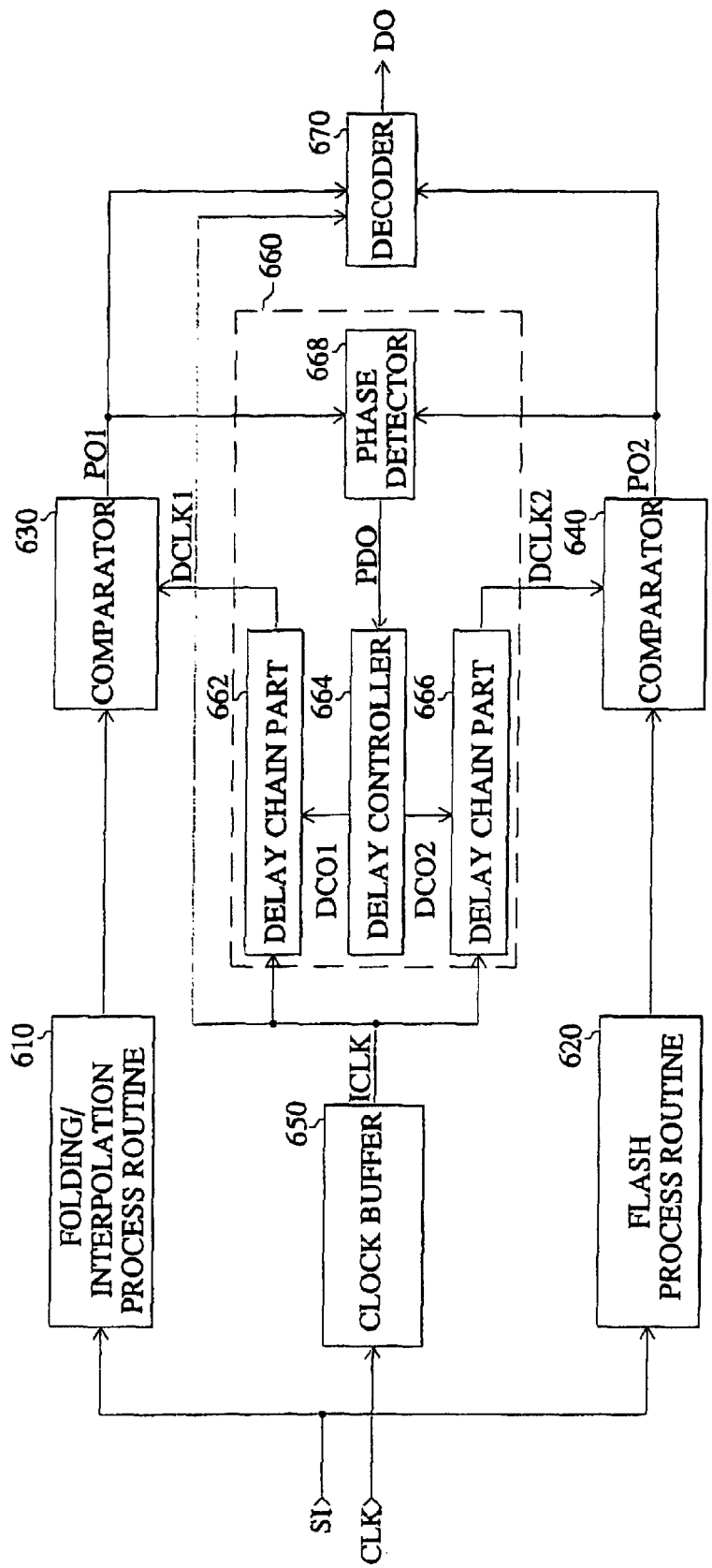
FIG. 6 is a block diagram illustrating A/D converters comprised of folding/interpolation and flash process routines according to other embodiments of the present invention.

FIG. 6 is a block diagram illustrating multi-process A/D converters comprised of folding/interpolation and flash process routines according to other embodiments of the present invention, and illustrates a detailed structure of a synchronizing circuit according to some embodiments of the present invention.

Referring to FIG. 6, the multi-process A/D converter comprises a clock buffer 650 for receiving and buffering an external clock signal CLK from, for example, an external terminal, and generating an internal clock signal ICLK therefrom. A folding/interpolation process routine 610 receives and folds an analog input signal SI, and generates a plurality of analog signals with phases different from one another by an interpolation therefrom. A comparator 630 receives output signals of the folding/interpolation process routine 610 and compares an analog signal with a reference voltage under the control of a delayed clock signal DCLK1, thereby generating a digital signal PO1 therefrom. A flash process routine 620 receives and processes the analog input signal SI. A comparator 640 receives the output signal of the flash process routine 620 and compares an analog signal with the reference voltage under the control of a delayed clock signal DCLK2, thereby generating a digital signal PO2 therefrom. A decoder 670 receives the internal clock signal ICLK from the clock buffer 650 and the output signals PO1, PO2 from the comparators 630 and 640, and converts the received signals into signals having a code format adapted to a digital logic circuit. A synchronizing circuit 660 receives the internal clock signal ICLK from the clock buffer 650 and the output signals PO1, PO2 from the comparators 630 and 640, thereby to generate delayed clock signals DCLK1, DCLK2 therefrom.

In some embodiments, the synchronizing circuit 660 comprises a phase detector 668 for receiving the digital signals PO1, PO2 from the comparators 630 and 640 and detecting phases of the received signals PO1, PO2, to thereby generate a signal PDO therefrom. A delay controller 664 receives the output signal PDO from the phase detector 668 and generates time delay control signals DCO1, DCO2 corresponding to a phase difference therefrom. A delay chain part 662 receives the internal clock signal ICLK from the clock buffer 650 and thereby generates the delayed clock signal DCLK1 therefrom, under the control of the time delay control signal DCO1. Finally, a delay chain part 666 receives the internal clock signal ICLK from the clock buffer 650 and generates the delayed clock signal DCLK2 therefrom, under the control of the time delay control signal DCO2.

Hereinafter, an operational example of the multi-process A/D converter according to embodiments of the present invention as illustrated in FIG. 6 will be described.

Referring to FIG. 6, the A/D converter receives an analog input signal SI from, for example, the external terminal and converts the received analog signal SI into the digital signals via both paths of the folding/interpolation process routine 610 and the flash process routine 620, to thereby generate a digital output signal DO of a desired bit number. In the A/D converter of FIG. 6, the analog input signal SI propagates with different time delays while passing through the different paths, so that it may be distorted with different patterns from one another. The synchronizing circuit 660 receives the respective output signals PO1, PO2 from the comparators 630 and 640, detecting phases of the signals PO1, PO2, and thereby generating the delayed clock signals DCLK1, DCLK2 which may have the time delays different from each other. The delayed clock signals DCLK1, DCLK2 are respectively applied to the comparators 630 and 640 respectively connected to the folding/interpolation process routine 610 and the flash process routine 620. Each comparator 630 and 640 compares the analog input signal SI with the reference voltage under the control of one of the delayed clock signals, thereby generating the digital signal PO1, PO2 therefrom. Thus, upon comparing the analog input signal with the reference voltage, the analog input signal is synchronized to the delayed clock signals DCLK1, DCLK2. Similarly, the comparators in respective paths are controlled by the delayed clock signals DCLK1, DCLK2 which may have time delays different from each other, so that the erroneous signals themselves generated due to the synchronization to the same internal clock signals can be corrected thereby reducing distortion of the analog input signals.

Figure 7:
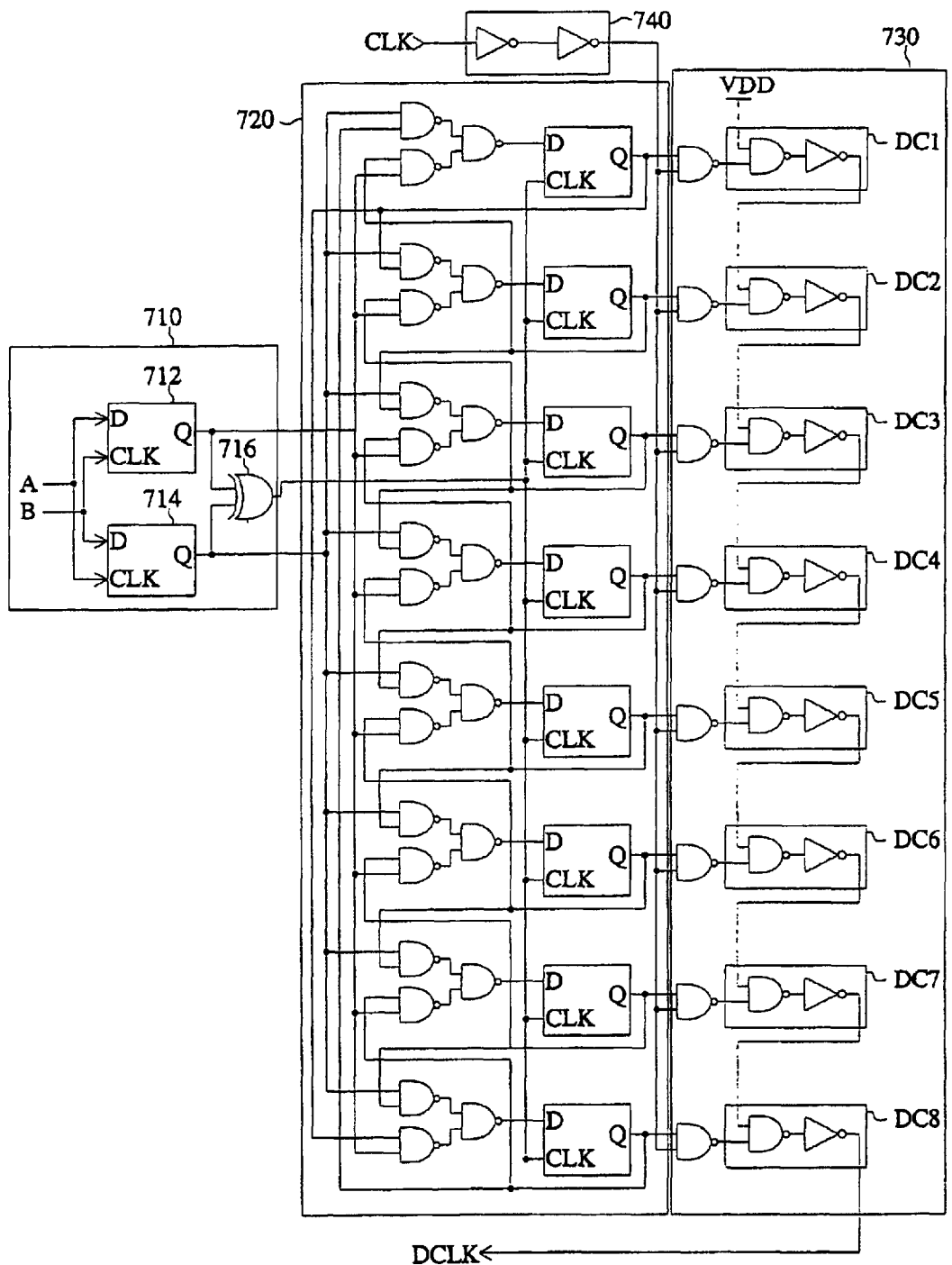
FIG. 7 is a circuit diagram illustrating synchronizing circuits of FIG. 6 using logic circuits, according to some embodiments of the present invention.

FIG. 7 is a logic diagram illustrating embodiments of a synchronizing circuit of FIG. 6 using a logic circuit. In FIG. 7, reference number 710 indicates the phase detector, 720 indicates the delay controller comprised of a plurality of shift registers, 730 indicates the delay chain part, and 740 indicates the clock buffer. In some embodiments, the phase detector 710 is comprised of a plurality of D-flip-flops and an exclusive OR logic 716, and the delay controller 720 is comprised of a plurality of NAND circuits and the plurality of D-flip-flops. The delay chain part 730 is comprised of a plurality of NAND circuits and a plurality of delay cells DC1–DC8.

A multi-process A/D converter in accordance with embodiments of the present invention as shown in FIG. 6 can use a delay controller 720 and a delay chain part 730 for each process routine. The phase detector 710 detects the phases of input signals A, B and transmits detected phase differences to the delay controller 720 comprised of the shift registers. When the phase detector 710 generates the phase difference therefrom, the delay controller 720 controls the time delay of the delayed clock signal by increasing or decreasing the number of the delay cells DC1–DC8.

As described above, multi-process A/D converters and methods in accordance with some embodiments of the present invention can reduce or correct an erroneous signal that is itself generated during synchronization of the input signal to the same internal clock signal by using the delayed clock signal. The output signals of respective paths may thereby be synchronized and distortion of the output signals may be reduced.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An analog-to-digital (A/D) converter, comprising:
a plurality of signal paths that are responsive to an analog input signal, to generate a multi-bit digital output signal therefrom; and
a circuit that is configured to generate delayed clock signals, which have delay times different from each other according to phase differences, by feeding-back and detecting a phase of signals in the signal paths, and configured to correct the signals in the signal paths by using the delayed clock signals.

2. An analog-to-digital (A/D) converter, comprising:
a clock buffer that is configured to receive and buffer an external clock signal, to thereby generate an internal clock signal;
a plurality of process routines that are configured to receive and process an analog input signal;
a plurality of comparators that are configured to receive analog signals from the plurality of process routines and to compare the received analog signals with a reference voltage, to thereby generate digital signals therefrom under control of a respective one of delayed clock signals;
a plurality of decoders that are configured to receive the digital signals from the plurality of comparators and to convert the received digital signals into a code format, to thereby generate converted digital signals; and
a synchronizing circuit that is configured to receive the internal clock signal from the clock buffer and the digital signals from the plurality of comparators and to generate the respective delayed clock signals therefrom.

3. An A/D converter according to claim 2, wherein the synchronizing circuit comprises:
a phase detector that is configured to receive the digital signals from the plurality of comparators, and to detect a phase difference between the digital signals;
a delay controller that is configured to receive an output signal of the phase detector, and to generate a respective time delay control signal for a respective one of the process routines, corresponding to the phase difference; and
a plurality of delay chain parts that are configured to receive the internal clock signal from the clock buffer and to generate the respective delayed clock signals, under control of a respective one of the time delay control signals.

4. An A/D converter according to claim 3, wherein the delay controller is comprised of a plurality of shift registers.

5. An A/D converter according to claim 2, wherein the plurality of process routines are comprised of folding/interpolation and/or flash process routines.

6. An A/D converter according to claim 3, wherein the plurality of process routines are comprised of folding/interpolation and/or flash process routines.

7. An analog-to-digital (A/D) converter, comprising:
a plurality of signal paths that are responsive to an analog input signal, to generate a multi-bit digital signal therefrom, a respective signal path including therein a comparator; and
a synchronizing circuit that is responsive to a clock signal and outputs of the comparators, to generate a respective delayed clock signal that is applied to a respective comparator.

8. An A/D converter according to claim 7 wherein the respective signal path also includes therein a respective decoder that is responsive to the respective comparator and to the clock signal.

9. An A/D converter according to claim 7 wherein the synchronizing circuit is configured to generate the respective delayed clock signal based on at least one phase difference between the outputs of the comparators.

10. An A/D converter according to claim 8 wherein the synchronizing circuit is configured to generate the respective delayed clock signal based on at least one phase difference between the outputs of the comparators.

11. A synchronizing method for an analog-to-digital (A/D) converter that includes a plurality of signal paths that are responsive to an analog input signal, to generate a multi-bit digital signal therefrom, a respective signal path including therein a comparator, the synchronizing method comprising:
generating a plurality of delayed clock signals from a clock signal and outputs of the comparators; and
applying a respective one of the delayed clock signals to a respective comparator.

12. A method according to claim 11 wherein the respective signal path also includes therein a respective decoder that is responsive to the respective comparator, the method further comprising:
applying the clock signal to the respective decoders.

13. A method according to claim 11 wherein generating the plurality of delayed clock signals comprises generating the plurality of delayed clock signals based on at least one phase difference between the outputs of the comparators.

14. A method according to claim 12 wherein generating the plurality of delayed clock signals comprises generating the plurality of delayed clock signals based on at least one phase difference between the outputs of the comparators.

* * * * *